United States Patent
Tu et al.

(10) Patent No.: US 9,024,351 B2
(45) Date of Patent: May 5, 2015

(54) SEMICONDUCTOR LIGHT-EMITTING STRUCTURE

(75) Inventors: Der-Wei Tu, Taipei (TW); Wei-Chih Wen, Hsinchu (TW); Tai-Chun Wang, Changhua County (TW); Po-Hung Lai, Taichung (TW); Chih-Ping Hsu, Changhua County (TW)

(73) Assignee: Huga Optotech Inc., Taichung (TW)

( * ) Notice: Subject to any disclaimer, the term of this patent is extended or adjusted under 35 U.S.C. 154(b) by 0 days.

(21) Appl. No.: 13/431,985

(22) Filed: Mar. 28, 2012

(65) Prior Publication Data

US 2012/0248405 A1    Oct. 4, 2012

(30) Foreign Application Priority Data

Apr. 1, 2011   (TW) .............................. 100111560 A (51) Int. Cl.
*H01L 33/36* (2010.01)
*H01L 33/44* (2010.01)

(52) U.S. Cl.
CPC ......... *H01L 33/44* (2013.01); *H01L 2933/0025* (2013.01)

(58) Field of Classification Search
CPC .............................. H01L 33/40; H01L 33/44
USPC ....................... 257/98, 99, E33.065
See application file for complete search history.

(56) References Cited

U.S. PATENT DOCUMENTS

| 6,794,690 B2 * | 9/2004 | Uemura .................... 257/183 |
| 2010/0133579 A1 * | 6/2010 | Kim et al. .................... 257/99 |
| 2012/0049232 A1 * | 3/2012 | Okabe et al. ................ 257/98 |
| 2012/0235204 A1 * | 9/2012 | Hodota et al. ............... 257/98 |

FOREIGN PATENT DOCUMENTS

WO    WO 2010131458 A1 * 11/2010

OTHER PUBLICATIONS

ELIE Design Calgaro Ster square ring w silver thread online posting. Dated Jul. 20, 2009 by the Internet Archive Wayback Machine. http://www.eliedesign.com/product/155.*
Vogt et al. "Characterization of thin titanium oxide adhesion layers on gold: resistivity, morphology, and composition."Surface Science 00 (1993).*

* cited by examiner

*Primary Examiner* — Cheung Lee
*Assistant Examiner* — Stephen Bradley
(74) *Attorney, Agent, or Firm* — Muncy, Geissler, Olds & Lowe, P.C.

(57) ABSTRACT

A semiconductor light-emitting structure including a first conductive type semiconductor layer, a second conductive type semiconductor layer, a light-emitting layer, an electrode, an insulating layer, and an adhesive layer is provided. The light-emitting layer is disposed between the first conductive type semiconductor layer and the second conductive type semiconductor layer. The electrode is disposed on the first conductive type semiconductor layer. The insulating layer covers a part of the first conductive type semiconductor layer and the electrode. The adhesive layer is disposed between the electrode and the insulating layer so as to bond the electrode and the insulating layer.

19 Claims, 5 Drawing Sheets

SEMICONDUCTOR LIGHT-EMITTING STRUCTURE

This application claims the priority benefit of Taiwan application serial no. 100111560, filed on Apr. 1, 2011. The entirety of the above-mentioned patent application is hereby incorporated by reference herein and made a part of this specification.

BACKGROUND OF THE INVENTION

1. Field of the Invention

The invention relates to a light-emitting structure. Particularly, the invention relates to a semiconductor light-emitting structure.

2. Description of Related Art

Along with development of photoelectric technology, fabrication and application of light-emitting diodes (LEDs) have gradually become mature. Since the LED has advantages of low pollution, low power consumption, short response time, long service life, etc., it has been widely used in various light source or illumination domains, and has replaced conventional light-emitting devices such as fluorescent tubes, incandescent bulbs or halogen lamps. Along with the world gradually rising environmental protection awareness, the LED is expected to become a major illumination light source in the future to replace the current fluorescent tubes.

A main structure of the LED (a LED chip) includes an N-type semiconductor layer, a light-emitting layer and a P-type semiconductor layer. Moreover, in order to connect the LED chip to an external circuit, electrodes are respectively disposed on the N-type semiconductor layer and the P-type semiconductor layer, and the electrodes are, for example, electrodes containing gold. The electrode can be electrically connected to an external circuit through wire bonding or flip-chip bonding. Moreover, a part of the surface of the conventional LED chip is covered by an insulating layer to avoid a short circuit phenomenon when the chip is polluted.

However, generally, a top surface or a side surface of the electrode of the LED chip is not covered by the insulating layer, or even if a part of the top surface or the side surface of the electrode is covered by the insulating layer when the electrode is originally manufactured, due to a poor adhesion between the insulating layer and the top surface or the side surface of the electrode, after a long time utilization, a part of the insulating layer covering the electrode may fall off. Therefore, water vapor is easy to invade the electrode. Generally, the bottom of the electrode has a metal adhesive layer suitable for adhering a semiconductor layer. When the metal adhesive layer encounters the water vapor or a reverse voltage, it is liable to dissociate and migrate to external of the electrode, so that the metal adhesive layer is gradually disappeared, which may result in a fact that the electrode falls off from the semiconductor layer. Therefore, a service life of the LED chip is hard to be prolonged due to falling off of the electrode.

SUMMARY OF THE INVENTION

The invention is directed to a semiconductor light-emitting structure having a relatively long service life.

An embodiment of the invention provides a semiconductor light-emitting structure including a first conductive type semiconductor layer, a second conductive type semiconductor layer, a light-emitting layer, an electrode, an insulating layer, and an adhesive layer. The light-emitting layer is disposed between the first conductive type semiconductor layer and the second conductive type semiconductor layer. The electrode is disposed on the first conductive type semiconductor layer. The insulating layer covers a part of the first conductive type semiconductor layer and the electrode. The adhesive layer is disposed between the electrode and the insulating layer, so as to bond the electrode and the insulating layer.

An embodiment of the invention provides a semiconductor light-emitting structure including a first conductive type semiconductor layer, a second conductive type semiconductor layer, a light-emitting layer, an electrode, and an insulating layer. The light-emitting layer is disposed between the first conductive type semiconductor layer and the second conductive type semiconductor layer. The electrode is disposed on the first conductive type semiconductor layer and includes a body and a first adhesive layer. The first adhesive layer is disposed between the body and the first conductive type semiconductor layer to bond the body and the first conductive type semiconductor layer. The insulating layer covers a part of the first conductive type semiconductor layer and the electrode. The semiconductor light-emitting structure further includes a second adhesive layer disposed between the body and the insulating layer, so as to bond the body and the insulating layer.

As described above, in the semiconductor light-emitting structure according to the embodiments of the invention, since the adhesive layer is used to bond the electrode and the insulating layer, the insulating layer is not easy to fall off from the electrode as utilization time is increased, so as to effectively protect the electrode from being invaded by water vapor. In this way, the electrode is not easy to fall off from the first conductive type semiconductor layer, and the service life of the semiconductor light-emitting structure is prolonged.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
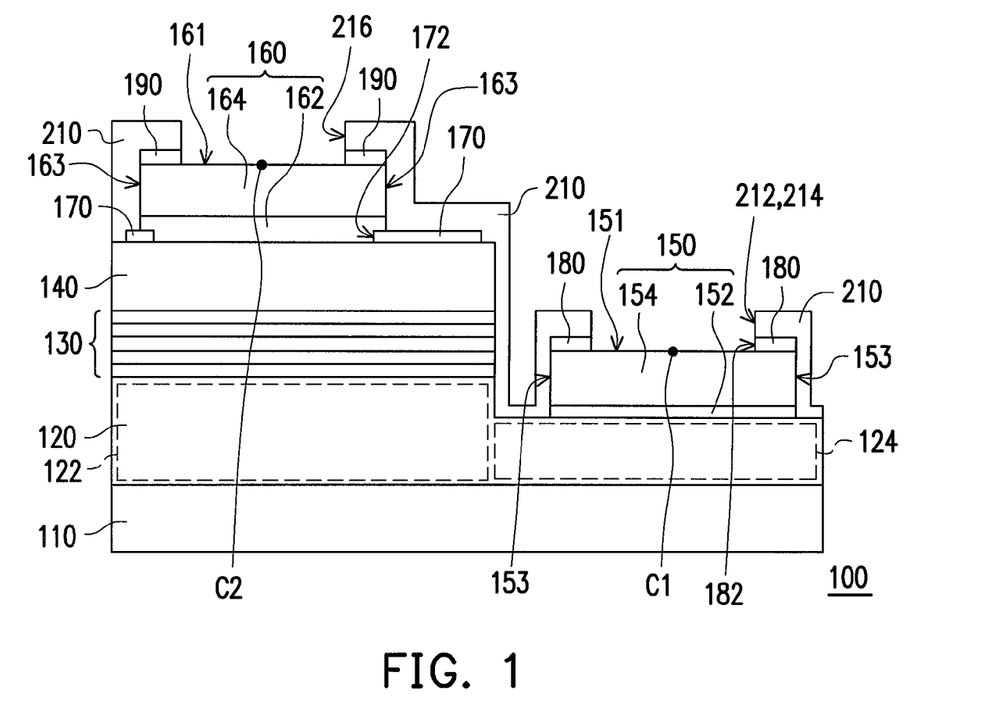
FIG. 1 is a cross-sectional view of a semiconductor light-emitting structure according to a first embodiment of the invention.
Figure 2A:
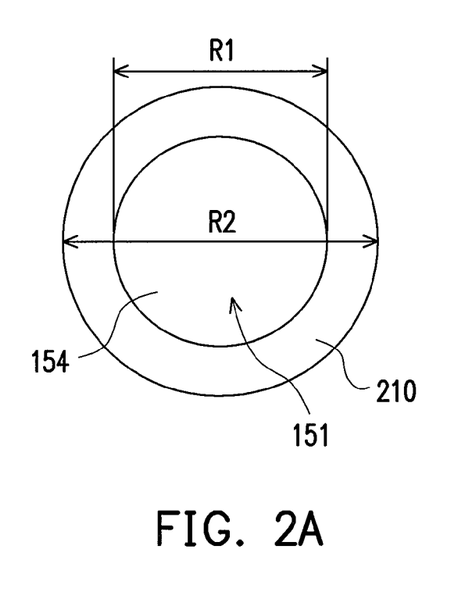
FIG. 2A is a top view of a first electrode of FIG. 1 and an insulating layer thereon.

FIG. 1 is a cross-sectional view of a semiconductor light-emitting structure according to a first embodiment of the invention, and FIG. 2A is a top view of a first electrode of FIG. 1 and an insulating layer thereon. Referring to FIG. 1 and FIG. 2A, the semiconductor light-emitting structure 100 according to this embodiment is, for example, a light-emitting diode (LED) chip structure. The semiconductor light-emitting structure 100 includes a first conductive type semiconductor layer 120, a second conductive type semiconductor layer 140, a light-emitting layer 130, a first electrode 150, an insulating layer 210, and an adhesive layer 180. The light-emitting layer 130 is disposed between the first conductive type semiconductor layer 120 and the second conductive type semiconductor layer 140. In the present embodiment, the first conductive type semiconductor layer 120 is an N-type semiconductor layer, and the second conductive type semiconductor layer 140 is a P-type semiconductor layer. However, in other embodiments, the first conductive type semiconductor layer 120 can be a P-type semiconductor layer, and the second conductive type semiconductor layer 140 is an N-type semiconductor layer. Moreover, in the present embodiment, the first conductive type semiconductor layer 120 is, for example, an N-type gallium nitride (GaN) layer, and the second conductive type semiconductor layer 140 is, for example, a P-type GaN layer. However, in other embodiments, the first conductive type semiconductor layer 120 and the second conductive type semiconductor layer 140 can also be gallium arsenide (GaAs) layers or other III-V semiconductor layers, II-VI semiconductor layers or other suitable semiconductor layers. Moreover, the light-emitting layer 130 is, for example, a quantum well layer or a multiple quantum well layer. In the present embodiment, the first conductive type semiconductor layer 120 is disposed on a substrate 110, where the substrate 110 is, for example, a silicon substrate, a copper substrate, a silicon carbide (SiC) substrate or a sapphire substrate.

The first electrode 150 is disposed on the first conductive type semiconductor layer 120. In the present embodiment, the first conductive type semiconductor layer 120 includes a platform region 122 and a subsidence region 124 connected to each other. A thickness of the platform region 122 is greater than a thickness of the subsidence region 124, and the first electrode 150 is disposed on the subsidence region 124. In the present embodiment, the first electrode 150 includes a plurality of metal layers 152 and 154 stacked in a sequence from a side closed to the first conductive type semiconductor layer 120 to a side away from the first conductive type semiconductor layer 120, and the metal layer 152 closest to the first conductive type semiconductor layer 120 is a metal adhesive layer. That is to say, the metal layer 154 may be a body of the first electrode 150, and the metal layer 152 may be an adhesive layer disposed between the body (i.e. the metal layer 154) and the first conductive type semiconductor layer 120 to bond the body (i.e. the metal layer 154) and the first conductive type semiconductor layer 120. In this embodiment, the material of the metal layer 152 (i.e. the adhesive layer) is a metal element which is selected to form ohmic contact with the first conductive type semiconductor layer 120. For example, the metal layer 152 is, for example, a chromium (Cr) layer, and the metal layer 154 is, for example, a gold (Au) layer. Since adhesion between the chromium layer and the first conductive type semiconductor layer 120 is better, the gold layer can be stably adhered to the first conductive type semiconductor layer 120 through the chromium layer. However, in other embodiments, the sequentially stacked metal layers can also be a nickel layer and a gold layer stacked in a sequence, a titanium layer, an aluminium layer, a titanium layer and a gold layer stacked in a sequence, a chromium layer, a platinum layer and a gold layer stacked in a sequence, a chromium layer, an aluminium layer, a platinum layer and a gold layer stacked in a sequence, or other suitable composite metal layers stacked in a sequence from the side closed to the first conductive type semiconductor layer 120 to the side away from the first conductive type semiconductor layer 120. Moreover, in an embodiment, the first electrode 150 can also be formed by a single metal layer, for example, the whole first electrode 150 is a copper layer.

The first electrode 150 has a first top surface 151 facing away from the first conductive type semiconductor layer 120 and a first side surface 153 connecting the first top surface 151 and the first conductive type semiconductor layer 120. The insulating layer 210 covers a part of the first conductive type semiconductor layer 120 and the first electrode 150. In this embodiment, the insulating layer 210 covers a part of the first conductive type semiconductor layer 120, the first side surface 153 of the first electrode 150, and the edge of the first top surface 151 of the first electrode 150. The insulating layer 210 has a first opening 212 for exposing a part of the first top surface 151 of the first electrode 150, for example, exposing a center C1 of the first top surface 151 and a central region therearound. The first electrode 150 can be electrically connected to an external circuit through wire bonding or flip-chip bonding.

The adhesive layer 180 is disposed between the first electrode 150 and the insulating layer 210, so as to bond the first electrode 150 and the insulating layer 210. In this embodiment, the adhesive layer 180 is disposed between the edge of the first top surface 151 and the insulating layer 210 for bonding the first top surface 151 and the insulating layer 210. In the present embodiment, a material of the insulating layer 210 is, for example, a compound not containing metallic element, and the compound not containing metallic element includes a compound containing metalloid elements or non-metallic elements. For example, in the present embodiment, the material of the insulating layer 210 is, for example, silicon oxide, and a chemical formula thereof is $SiO_x$, where x is greater than 0. Alternatively, in other embodiments, the material of the insulating layer 210 can also be other oxides not containing metallic element, nitrides not containing metallic element, organic compounds not containing metallic element, or other compounds not containing metallic element. For example, in other embodiments, the material of the insulating layer 210 can be silicon nitride. In the present embodiment, a material of the adhesive layer 180 is pure metal, for example, titanium. However, in other embodiments, the material of the adhesive layer 180 includes at least one of titanium, molybdenum, thallium, nickel, aluminium, chromium and tungsten. In this embodiment, the thickness of the adhesive layer 180 is between 20 angstroms (Å) and 1000 Å, so that the electrical property and the adhesive property of the adhesive layer 180 are both good.

In the semiconductor light-emitting structure 100 of the present embodiment, since the adhesive layer 180 is used to bond the first electrode 150 and the insulating layer 210, the insulating layer 210 is not easy to fall off from the first top surface 151 of the first electrode 150 as utilization time increases, so as to protect the first electrode 150 from being invaded by water vapor. In this way, the first electrode 150 is not easy to fall off from the first conductive type semiconductor layer 120, so that the service life of the semiconductor light-emitting structure 100 is prolonged. For example, due to the protection of the insulating layer 210, the water vapor is not easy to invade the metal layer 152 (for example, the chromium layer) adhering the first conductive type semiconductor layer 120 to dissociate and migrate the chromium in the metal layer 152. In this way, the metal layer 152 is not disappeared as the utilization time increases, so that the first electrode 150 is not easy to fall off from the first conductive type semiconductor layer 120.

In order to prevent the water vapor from invading the bottom of the first electrode 150 (for example invading the metal layer 152), in the present embodiment, an orthogonal projection of the insulating layer 210 on the first side surface 153 of the first electrode 150 covers the whole first side surface 153 of the first electrode 150. In other words, the insulating layer 210 directly or indirectly wraps the whole first side surface 153 of the first electrode 150 to prevent water vapor invasion.

Figure 2B:
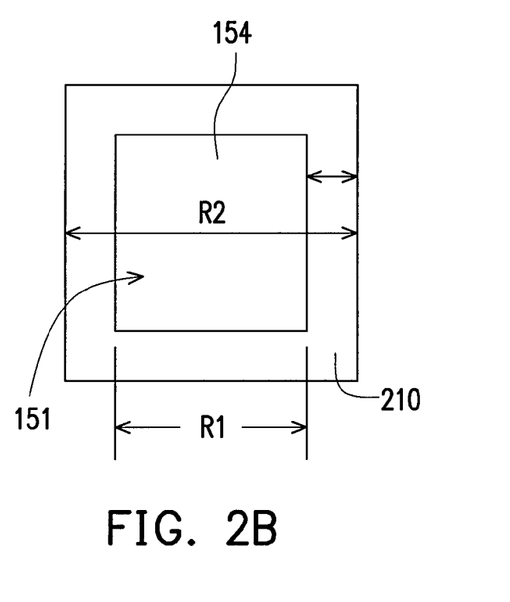
FIG. 2B illustrates a variation of the first electrode of FIG. 2A and the insulating layer thereon.

In this embodiment, the adhesive layer 180 directly connects the first electrode 150 and the insulating layer 210, so as to bond the first electrode 150 and the insulating layer 210. Besides, in the present embodiment, the adhesive layer 180 may have a ring shape with an opening in a top-view, i.e. the adhesive layer 180 surrounds the center C1 of the first top surface 151. In addition, the opening exposes both or one of the first electrode 150 and the adhesive layer 180. Moreover, in other embodiments, an inner edge 214 of the first opening 212 of the insulating layer 210 is substantially aligned to an inner edge 182 of the adhesive layer 180 closed to the center C1. In the present embodiment, the first electrode 150 has a round shape, and the adhesive layer 180 has a round ring shape, as that shown in FIG. 2A. In another embodiment, the first electrode 150 may also have a rectangular shape, and the adhesive layer 180 has a rectangular ring shape, as that shown in FIG. 2B. However, the shapes of the first electrode 150 and the adhesive layer 180 are not limited by the invention. In other embodiments, the first electrode 150 and the adhesive layer 180 can also have other regular or irregular shapes.

Moreover, in the present embodiment, a ratio between an inner diameter R1 of the first opening 212 (or the inner diameter of the opening of the adhesive layer 180) and an outer diameter R2 of the first electrode 150 is greater than 0.2 and is smaller than 1. In this way, besides that the adhesive layer 180 is effectively adhered to the insulating layer 210, the first electrode 150 can be electrically connected to the external circuit through wire bonding or flip-chip bonding. To achieve a good electrical connection state between the first electrode 150 and the external circuit, in an embodiment, the ratio between the inner diameter R1 and the outer diameter R2 is greater than 0.5 and smaller than 1.

In the present embodiment, the semiconductor light-emitting structure 100 further includes a second electrode 160 and an adhesive layer 190. The second electrode 160 is disposed on the second conductive type semiconductor layer 140, and the second electrode 160 has a second top surface 161 facing away from the second conductive type semiconductor layer 140 and a second side surface 163 connecting the second top surface 161 and the second conductive type semiconductor layer 140. The insulating layer 210 covers a part of the second conductive type semiconductor layer 140, the second side surface 163 of the second electrode 160, and the edge of the second top surface 161 of the second electrode 160. Moreover, the insulating layer 210 has a second opening 216 for exposing a part of the second top surface 161 of the second electrode 160, for example, exposing a center C2 of the second top surface 161 and a central region therearound. The adhesive layer 190 is disposed between the edge of the second top surface 161 and the insulating layer 210 to bond the second top surface 161 and the insulating layer 210.

By stably sticking the insulating layer 210 through the adhesive layer 190, the insulating layer 210 is not easy to fall off from the second electrode 160 after long time utilization. In this way, the insulating layer 210 can effectively protect the second electrode 160 from being invaded by water vapor, so that the second electrode 160 is not easy to fall off from the second conductive type semiconductor layer 140, and the service life of the semiconductor light-emitting structure 100 is prolonged. Other details (for example, shapes, materials, ratios and effects) of the second electrode 160, the adhesive layer 190 and the second opening 216 can refer to the above-mentioned details (for example, shapes, materials, ratios and effects) of the first electrode 150, the adhesive layer 180 and the first opening 212, which are not repeated herein. Moreover, metal layers 162 and 164 sequentially stacked on the second electrode 160 can be a chromium layer and a gold layer. However, in other embodiments, the second electrode 160 can also use other materials, and these materials can refer to the materials of the first electrode 150, which are not repeated herein.

In order to prevent the water vapor from invading the bottom of the second electrode 160 (for example invading the metal layer 162), in the present embodiment, an orthogonal projection of the insulating layer 210 on the second side surface 163 of the second electrode 160 covers the whole second side surface 163 of the second electrode 160. In other words, the insulating layer 210 directly or indirectly wraps the whole second side surface 163 of the second electrode 160 to prevent water vapor invasion. Moreover, to prevent short circuit of the semiconductor light-emitting structure 100 caused by an external pollution source (for example, liquid or conductive particles), in the present embodiment, the insulating layer 210 wraps at least a part of the second conductive type semiconductor layer 140, the light-emitting layer 130, and a side surface of the first conductive type semiconductor layer 120. Moreover, in the present embodiment, the insulating layer 210 is integrally formed to sequentially extend from the first electrode 150 to the second electrode 160 through the first conductive type semiconductor layer 120, the light-emitting layer 130 and the side surface of the second conductive type semiconductor layer 140.

Moreover, in the present embodiment, the semiconductor light-emitting structure 100 further includes a transparent conductive layer 170, which is disposed on the second conductive type semiconductor layer 140, and is electrically connected to the second electrode 160. The transparent conductive layer 170 has an opening 172, and the second electrode 160 penetrates through the opening 172 to connect the second conductive type semiconductor layer 140. A material of the transparent conductive layer 170 is, for example, indium tin oxide (ITO) or other suitable transparent conductive materials.

Figure 3:
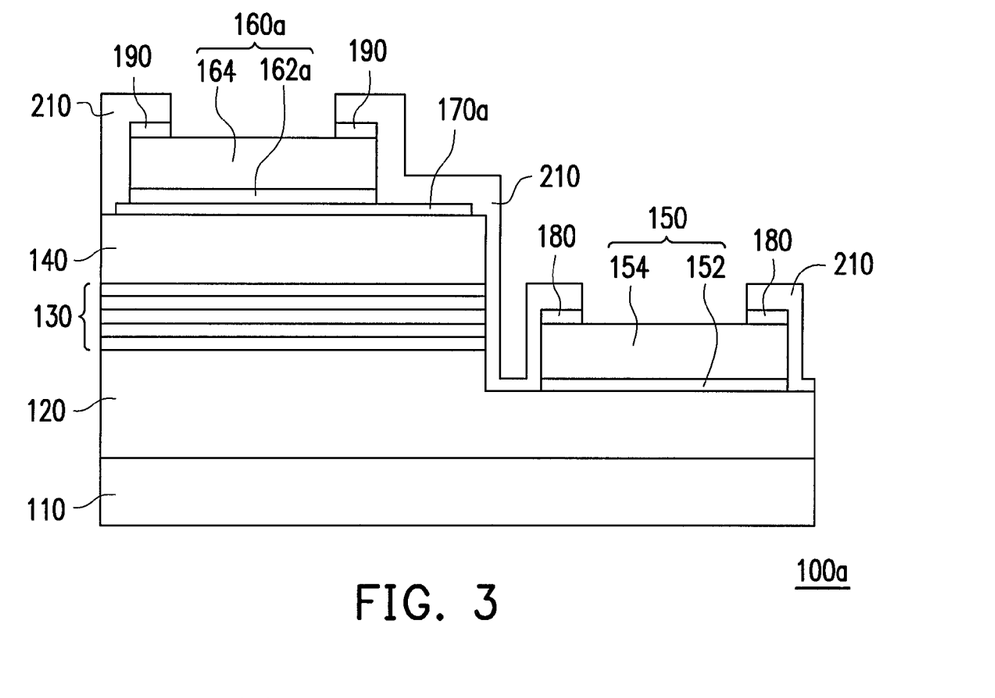
FIG. 3 is a cross-sectional view of a semiconductor light-emitting structure according to a second embodiment of the invention.

FIG. 3 is a cross-sectional view of a semiconductor light-emitting structure according to a second embodiment of the invention. Referring to FIG. 3, the semiconductor light-emitting structure 100a of the present embodiment is similar to the semiconductor light-emitting structure 100 of FIG. 1, and a difference therebetween is as follows. In the present embodiment, a second electrode 160a does not penetrate through a transparent conductive layer 170a, and the transparent conductive layer 170a connects the second electrode 160a and the second conductive type semiconductor layer 140. In other words, a metal layer 162a of the second electrode 160a does not directly contact the second conductive type semiconductor layer 140, but is disposed on the second conductive type semiconductor layer 140 through the transparent conductive layer 170a.

Figure 4:
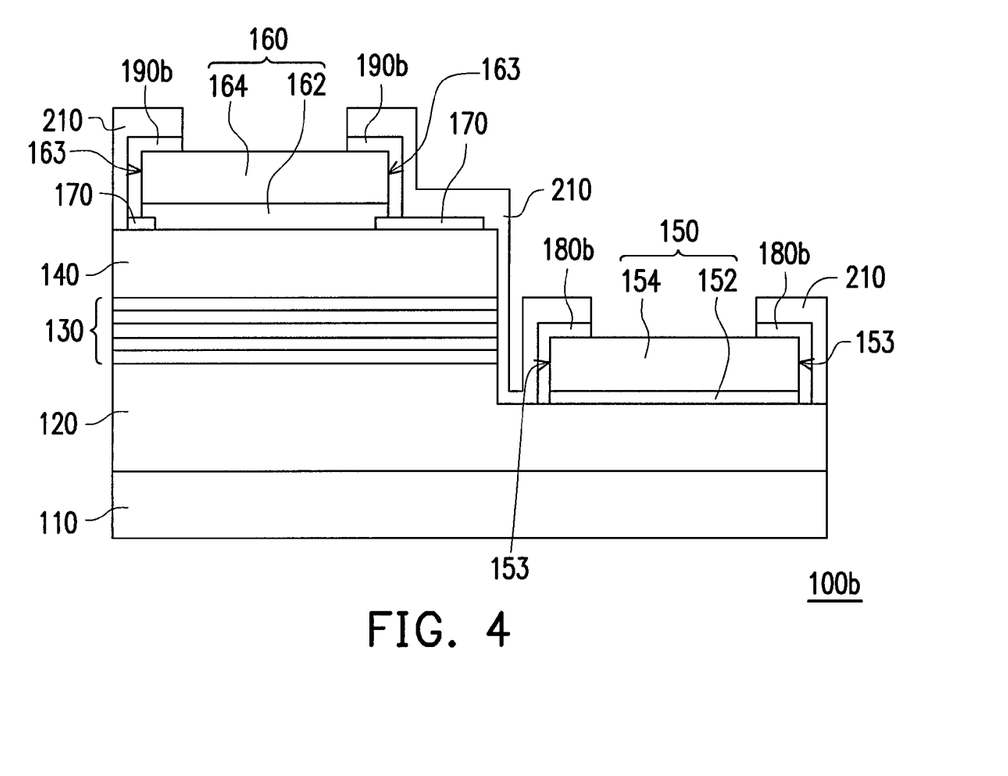
FIG. 4 is a cross-sectional view of a semiconductor light-emitting structure according to a third embodiment of the invention.

FIG. 4 is a cross-sectional view of a semiconductor light-emitting structure according to a third embodiment of the invention. Referring to FIG. 4, the semiconductor light-emitting structure 100b of the present embodiment is similar to the semiconductor light-emitting structure 100 of FIG. 1, and differences therebetween are as follows. In the semiconductor light-emitting structure 100b of the present embodiment, an adhesive layer 180b is further disposed between the first side surface 153 of the first electrode 150 and a part of the insulating layer 210 covering the first side surface 153, so as to bond the first side surface 153 and the insulating layer 210. In other words, the adhesive layer 180b is disposed on both the top surface 151 and the side surface 153 of the first electrode 150 and extends to the first conductive type semiconductor layer 120. In this way, the insulating layer 210 can be stably adhered to the first electrode 150, and is not easy to fall off from the first electrode 150 after long time utilization. Similarly, in the present embodiment, an adhesive layer 190b can be disposed between the second side surface 163 of the second electrode 160 and a part of the insulating layer 210 covering the second side surface 163, so as to bond the second side surface 163 and the insulating layer 210.

Figure 5:
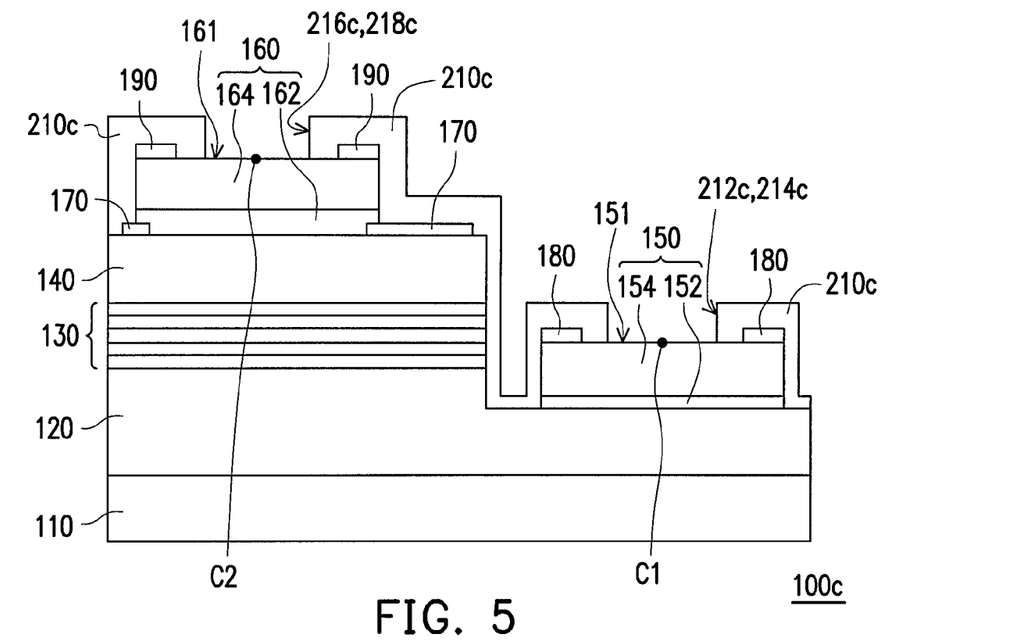
FIG. 5 is a cross-sectional view of a semiconductor light-emitting structure according to a fourth embodiment of the invention.

FIG. 5 is a cross-sectional view of a semiconductor light-emitting structure according to a fourth embodiment of the invention. Referring to FIG. 5, the semiconductor light-emitting structure 100c of the present embodiment is similar to the semiconductor light-emitting structure 100 of FIG. 1, and differences therebetween are as follows. In the semiconductor light-emitting structure 100c of the present embodiment, an insulating layer 210c wraps the adhesive layer 180, and an inner edge 214c of a first opening 212c of the insulating layer 210c is located between the center C1 of the first top surface 151 and the adhesive layer 180. Similarly, in the present embodiment, the insulating layer 210c can also wrap the adhesive layer 190, and an inner edge 218c of a second opening 216c of the insulating layer 210c is located between the center C2 of the second top surface 161 and the adhesive layer 190.

Figure 6:
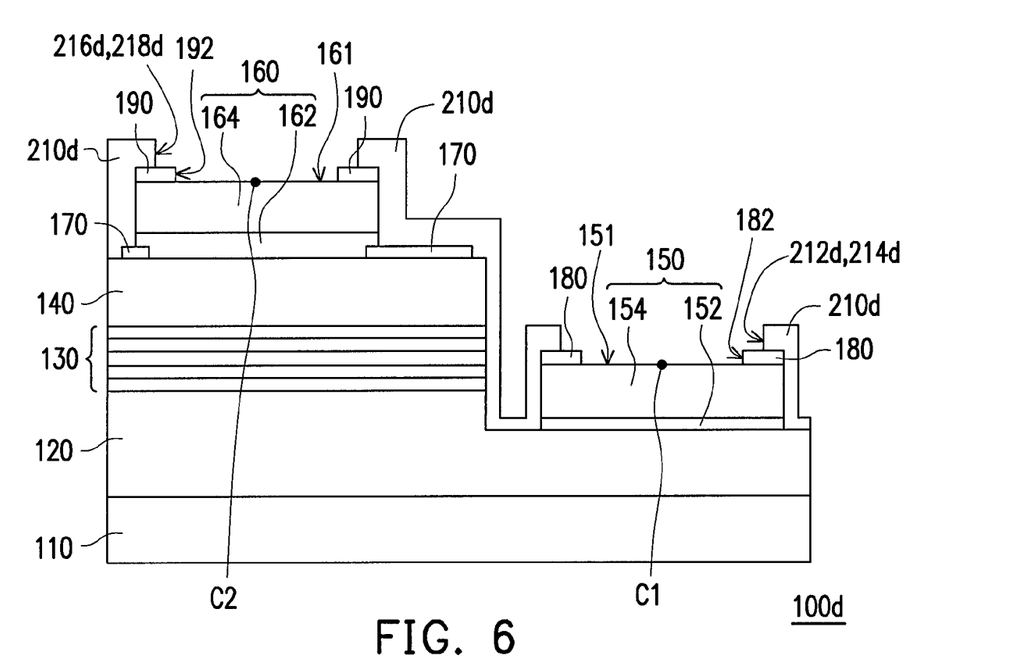
FIG. 6 is a cross-sectional view of a semiconductor light-emitting structure according to a fifth embodiment of the invention.

FIG. 6 is a cross-sectional view of a semiconductor light-emitting structure according to a fifth embodiment of the invention. Referring to FIG. 6, the semiconductor light-emitting structure 100d of the present embodiment is similar to the semiconductor light-emitting structure 100 of FIG. 1, and differences therebetween are as follows. In the semiconductor light-emitting structure 100d of the present embodiment, an insulating layer 210d exposes a part of the adhesive layer 180, and the inner edge 182 of the adhesive layer 180 closed to the center C1 of the first top surface 151 is located between the center C1 of the first top surface 151 and an inner edge 214d of a first opening 212d of the insulating layer 210d. Similarly, in the present embodiment, the insulating layer 210d also exposes a part of the adhesive layer 190, and the inner edge 192 of the second adhesive layer 190 closed to the center C2 of the second top surface 161 is located between the center C2 of the second top surface 161 and an inner edge 218d of a second opening 216d of the insulating layer 210d.

Figure 7:
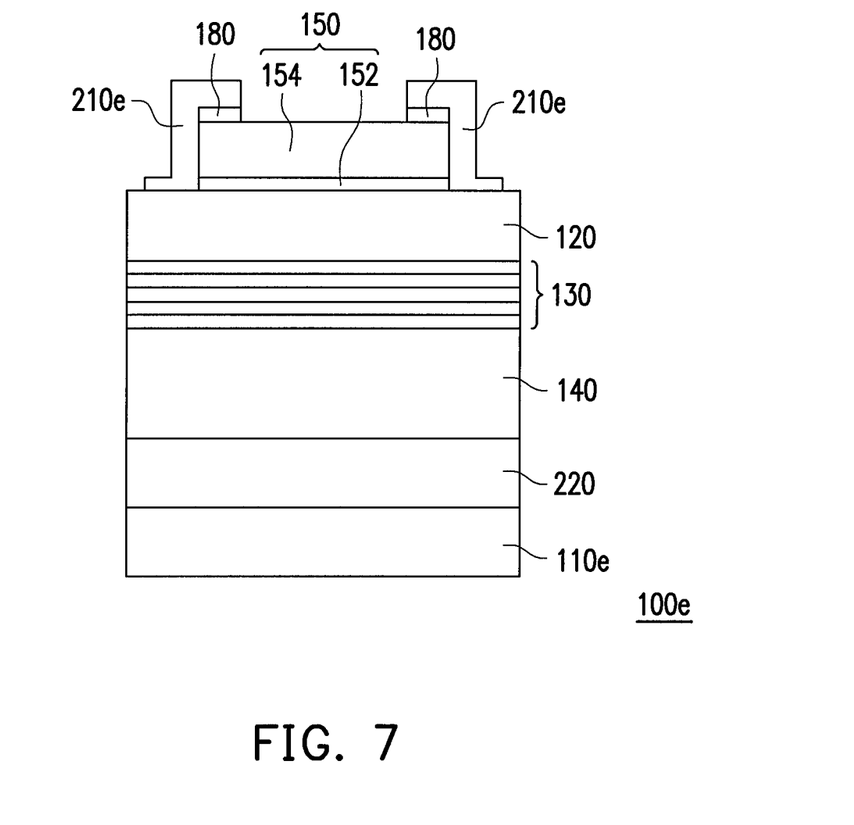
FIG. 7 is a cross-sectional view of a semiconductor light-emitting structure according to a sixth embodiment of the invention.

FIG. 7 is a cross-sectional view of a semiconductor light-emitting structure according to a sixth embodiment of the invention. Referring to FIG. 7, the semiconductor light-emitting structure 100e of the present embodiment is similar to the semiconductor light-emitting structure 100 of FIG. 1, and differences therebetween are as follows. The semiconductor light-emitting structure 100 of FIG. 1 has a horizontal electrode structure, and the semiconductor light-emitting structure 100e of the present embodiment has a vertical electrode structure. In detail, in the present embodiment, a substrate 110e is a conductive substrate, and the substrate 110e can serve as an electrode. Moreover, the substrate 110e (i.e. the electrode) and the first electrode 150 are disposed at two opposite sides of the semiconductor light-emitting structure 100e, and such structure is generally referred to as the vertical electrode structure. Moreover, in the present embodiment, the first conductive type semiconductor layer 120 is disposed between the first electrode 150 and the light-emitting layer 130, and the second conductive type semiconductor layer 140 is disposed between the light-emitting layer 130 and the substrate 110e. Moreover, in the present embodiment, a conductive type reflective layer 220 (for example, a metal reflective layer) can be disposed between the second conductive type semiconductor layer 140 and the substrate 110e to reflect light emitted from the light-emitting layer 130. Relative positions and other details of an insulating layer 210e, the first electrode 150 and the adhesive layer 180 can refer to the relative positions and other details of the insulating layer 210, the first electrode 150 and the adhesive layer 180 of the embodiment of FIG. 1, and detailed descriptions thereof are not repeated. Moreover, the insulating layer 210e covers a part of the first conductive type semiconductor layer 120.

Figure 8:
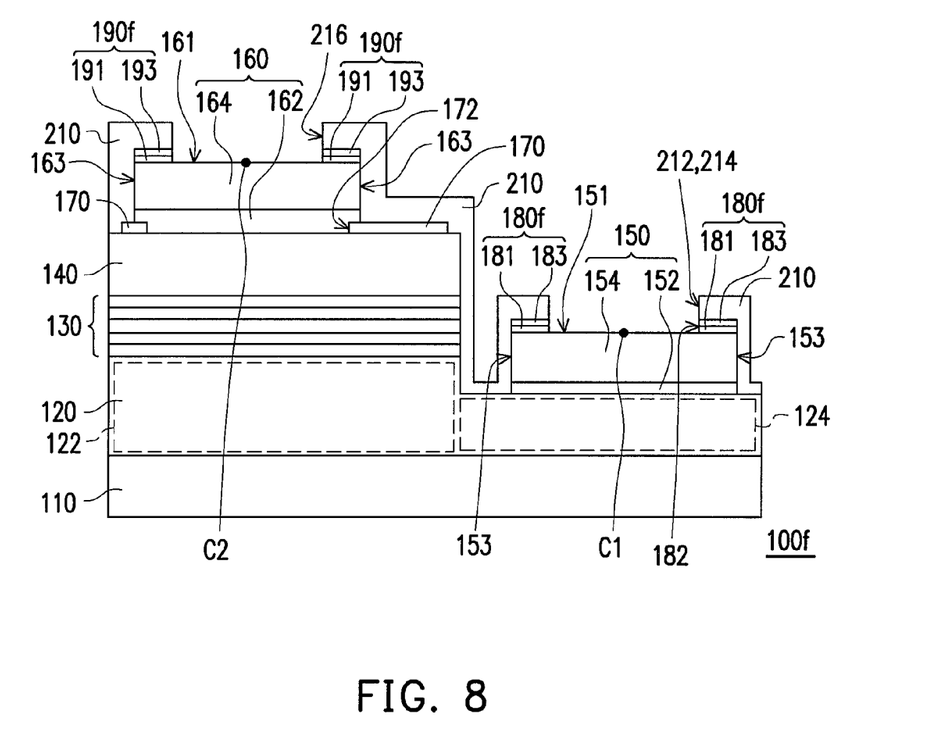
FIG. 8 is a cross-sectional view of a semiconductor light-emitting structure according to a seventh embodiment of the invention.

FIG. 8 is a cross-sectional view of a semiconductor light-emitting structure according to a seventh embodiment of the invention. Referring to FIG. 8, the semiconductor light-emitting structure 100f of the present embodiment is similar to the semiconductor light-emitting structure 100 of FIG. 1, and differences therebetween are as follows. In the semiconductor light-emitting structure 100f, an adhesive layer 180f includes a plurality of sub adhesive layers 181 and 183 made of different materials, and the sub adhesive layers 181 and 183 are stacked to form the adhesive layer 180f. The adhesive layer 190f includes a plurality of sub adhesive layers 191 and 193 made of different materials, and the sub adhesive layers 191 and 193 are stacked to form the adhesive layer 190f. In the present embodiment, the sub adhesive layers 181 and 183 are, for example, respectively a chromium layer and a titanium layer, and the sub adhesive layers 191 and 193 are, for example, respectively a chromium layer and a titanium layer. Alternatively, in another embodiment, the sub adhesive layers 181 and 183 are respectively a titanium layer and a titanium oxide layer, and the sub adhesive layers 191 and 193 are respectively a titanium layer and a titanium oxide layer. Moreover, the number of the sub adhesive layers included in the adhesive layer 180f or the adhesive layer 190f is not limited by the invention. In other embodiments, the number of the sub adhesive layers included in the adhesive layer 180f or the adhesive layer 190f can be greater than or equal to 3.

The adhesive layer 180f and the adhesive layer 190f respectively including a plurality of the sub adhesive layers can also be applied to the other aforementioned embodiments, for example, the second to the six embodiments to replace the adhesive layer and the adhesive layer that respectively have a single layer structure.

In summary, in the semiconductor light-emitting structure according to the embodiments of the invention, since the adhesive layer is used to bond the first electrode and the insulating layer, the insulating layer is not easy to fall off from the first top surface of the first electrode as utilization time is increased, so as to effectively protect the electrode from being invaded by water vapor. In this way, the first electrode is not easy to fall off from the first conductive type semiconductor layer, and the service life of the semiconductor light-emitting structure is prolonged.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A semiconductor light-emitting structure, comprising:
a first semiconductor layer;
a second semiconductor layer;
a light-emitting layer, disposed between the first semiconductor layer and the second semiconductor layer;
an electrode, disposed on the first semiconductor layer;
an insulating layer, covering a part of the electrode; and
an adhesive layer formed in a ring having inner and outer perimeters with a similar shape, comprising a plurality of stacked sub adhesive layers and disposed on a top surface and a side surface of the electrode;
wherein the insulating layer wraps the adhesive layer, a number of the plurality of stacked sub adhesive layers is greater than or equal to 3, a material of each of the plurality of stacked sub adhesive layers comprises titanium, molybdenum, thallium, nickel, aluminum, chromium, tungsten or oxides thereof, and the materials of the sub adhesive layers are different.

2. The semiconductor light-emitting structure as claimed in claim 1, wherein the ring shape has an opening in a top-view.

3. The semiconductor light-emitting structure as claimed in claim 2, wherein a ratio of an inner diameter of the opening to an outer diameter of the electrode is greater than 0.2 and smaller than 1.

4. The semiconductor light-emitting structure as claimed in claim 2, wherein the opening exposes both or one of the electrode and the adhesive layer.

5. The semiconductor light-emitting structure as claimed in claim 1, wherein a material of the insulating layer is a compound not containing metallic element.

6. The semiconductor light-emitting structure as claimed in claim 1, wherein a thickness of the adhesive layer is between 20 Å and 1000 Å.

7. The semiconductor light-emitting structure as claimed in claim 1, wherein the adhesive layer extends to a top surface of the first semiconductor layer.

8. The semiconductor light-emitting structure as claimed in claim 1, wherein the adhesive layer extends to a top surface of a transparent conductive layer.

9. The semiconductor light-emitting structure as claimed in claim 1, wherein the stacked sub adhesive layers comprise a metal layer and a metal oxide layer, and a metal element of the metal layer and a metal element of the metal oxide layer are the same.

10. The semiconductor light-emitting structure as claimed in claim 1, wherein one of the stacked sub layers is a Ti layer, another one of the stacked sub layers is a $TiO_2$ layer, and the electrode comprises a gold layer contacting to the adhesive layer.

11. A semiconductor light-emitting structure, comprising:
a first semiconductor layer;
a second semiconductor layer;
a light-emitting layer, disposed between the first semiconductor layer and the second semiconductor layer;
an electrode, disposed on the first semiconductor layer and comprising:
a body; and
a first adhesive layer, disposed between the body and the first semiconductor layer to bond the body and the first semiconductor layer;
a second adhesive layer formed in a ring having inner and outer perimeters with a similar shape; and
an insulating layer substantially wrapping the first adhesive layer and the second adhesive layer;
wherein the second adhesive layer is disposed between the body and the insulating layer;
wherein the second adhesive layer comprising a plurality of stacked sub adhesive layers, a number of the plurality of stacked sub adhesive layers is greater than or equal to 3, a material of each of the plurality of stacked sub adhesive layers comprises titanium, molybdenum, thallium, nickel, aluminum, chromium, tungsten, or oxides thereof, and the materials of the sub adhesive layers are different.

12. The semiconductor light-emitting structure as claimed in claim 11, wherein the ring shape has an opening in a top-view.

13. The semiconductor light-emitting structure as claimed in claim 11, wherein a ratio of an inner diameter of the opening to an outer diameter of the electrode is greater than 0.2 and smaller than 1.

14. The semiconductor light-emitting structure as claimed in claim 11, wherein the opening exposes both or one of the electrode and the second adhesive layer.

15. The semiconductor light-emitting structure as claimed in claim 11, wherein a material of the insulating layer is a compound not containing metallic element.

16. The semiconductor light-emitting structure as claimed in claim 11, wherein a material of the first adhesive layer is a metal element which is selected to form ohmic contact with the first semiconductor layer.

17. The semiconductor light-emitting structure as claimed in claim 11, wherein the thickness of the second adhesive layer is between 20 Å and 1000 Å.

18. The semiconductor light-emitting structure as claimed in claim 11, wherein the stacked sub adhesive layers comprise a metal layer and a metal oxide layer, and a metal element of the metal layer and a metal element of the metal oxide layer are the same.

19. The semiconductor light-emitting structure as claimed in claim 11, wherein one of the stacked sub layers is a Ti layer, another one of the stacked sub layers is a $TiO_2$ layer, and the electrode comprises a gold layer contacting to the second adhesive layer.

* * * * *